(12) United States Patent
Chang

(10) Patent No.: US 11,777,477 B2
(45) Date of Patent: Oct. 3, 2023

(54) DIGITAL CIRCUIT DEVICE AND VOLTAGE DROP DETECTOR CIRCUITRY

(71) Applicant: REALTEK SEMICONDUCTOR CORPORATION, Hsinchu (TW)

(72) Inventor: Chi-Fu Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 320 days.

(21) Appl. No.: 17/238,245

(22) Filed: Apr. 23, 2021

(65) Prior Publication Data

US 2021/0376821 A1   Dec. 2, 2021

(30) Foreign Application Priority Data

May 29, 2020 (TW) .................................. 109118166

(51) Int. Cl.
*H02H 1/00* (2006.01)
*H03K 5/00* (2006.01)
*H03K 3/037* (2006.01)
*G06F 1/08* (2006.01)
*G06F 1/30* (2006.01)
*G01R 19/10* (2006.01)

(52) U.S. Cl.
CPC ......... *H03K 5/00006* (2013.01); *G01R 19/10* (2013.01); *G06F 1/08* (2013.01); *G06F 1/30* (2013.01); *H02H 1/0007* (2013.01); *H03K 3/037* (2013.01); *H03K 2005/00078* (2013.01)

(58) Field of Classification Search
None
See application file for complete search history.

(56) References Cited

U.S. PATENT DOCUMENTS

| | | | |
|---|---|---|---|
| 7,239,495 B2* | 7/2007 | Mori ................... | H03K 17/0822 361/93.1 |
| 2007/0296421 A1* | 12/2007 | Matsunaga ...... | G01R 31/31701 324/713 |
| 2009/0257164 A1* | 10/2009 | Ikeuchi ..................... | G01K 7/01 361/101 |
| 2016/0164511 A1* | 6/2016 | Strutt ..................... | H03K 17/74 327/434 |
| 2017/0177055 A1* | 6/2017 | Whatmough ........... | G06F 1/324 |

* cited by examiner

*Primary Examiner* — Stephen W Jackson
(74) *Attorney, Agent, or Firm* — WPAT, P.C

(57) ABSTRACT

A digital circuit device includes a power supply circuitry, a digital circuitry, a digital circuitry, and a protection circuitry. The power supply circuitry is configured to output a supply voltage. The digital circuitry is configured to be driven by the supply voltage, and is configured to perform at least one operation according to a first clock signal. The protection circuitry is configured to generate the first clock signal according to at least one of a voltage drop of the supply voltage and a load signal sent from the digital circuitry.

15 Claims, 6 Drawing Sheets

DIGITAL CIRCUIT DEVICE AND VOLTAGE DROP DETECTOR CIRCUITRY

BACKGROUND

1. Technical Field

The present disclosure relates to a digital circuit device, especially to a digital circuit device able to regulate power consumption automatically and a voltage drop detector circuit thereof.

2. Description of Related Art

In practical applications, in order to properly operate under various process variations, temperature variations, and/or voltage variations, a digital circuit device is required to be over-designed during a design phase. For example, when performing a calculation having high-intensive computation or during a power transition, a variation of an internal voltage in the digital circuit device may exceed 20% of a predetermined value. In order to tolerate such voltage variation, the design of the digital circuit device is required to be over-constrained, which results in higher power consumption and/or larger circuit area.

SUMMARY

In some embodiments, a digital circuit device includes a power supply circuitry, a digital circuitry, a digital circuitry, and a protection circuitry. The power supply circuitry is configured to output a supply voltage. The digital circuitry is configured to be driven by the supply voltage, and is configured to perform at least one operation according to a first clock signal. The protection circuitry is configured to generate the first clock signal according to at least one of a voltage drop of the supply voltage and a load signal sent from the digital circuitry.

In some embodiments, a voltage drop detector circuit includes a first flip flop circuit, a plurality of first delay circuits, a plurality of second delay circuits, a logic gate circuit, and a second flip flop circuit. The first flip flop circuit is configured to output an enable signal to be a testing signal according to a clock signal. The plurality of first delay circuits are configured to be driven by a supply voltage and to delay the testing signal to generate a plurality of flag signals, in which the plurality of flag signals are read in response to an update signal to indicate a voltage drop of the supply voltage. The plurality of second delay circuits are configured to be driven by the supply voltage and to delay the testing signal, in order to generate a first signal. The logic gate circuit is configured to generate a second signal according to the first signal and a control signal. The second flip flop circuit is configured to output the second signal to be the update signal according to the clock signal.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. As used herein, the term "at least one of A and B" includes any and all combinations of one or more of the associated listed items (i.e., A and B). Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference numbers.

Figure 1:
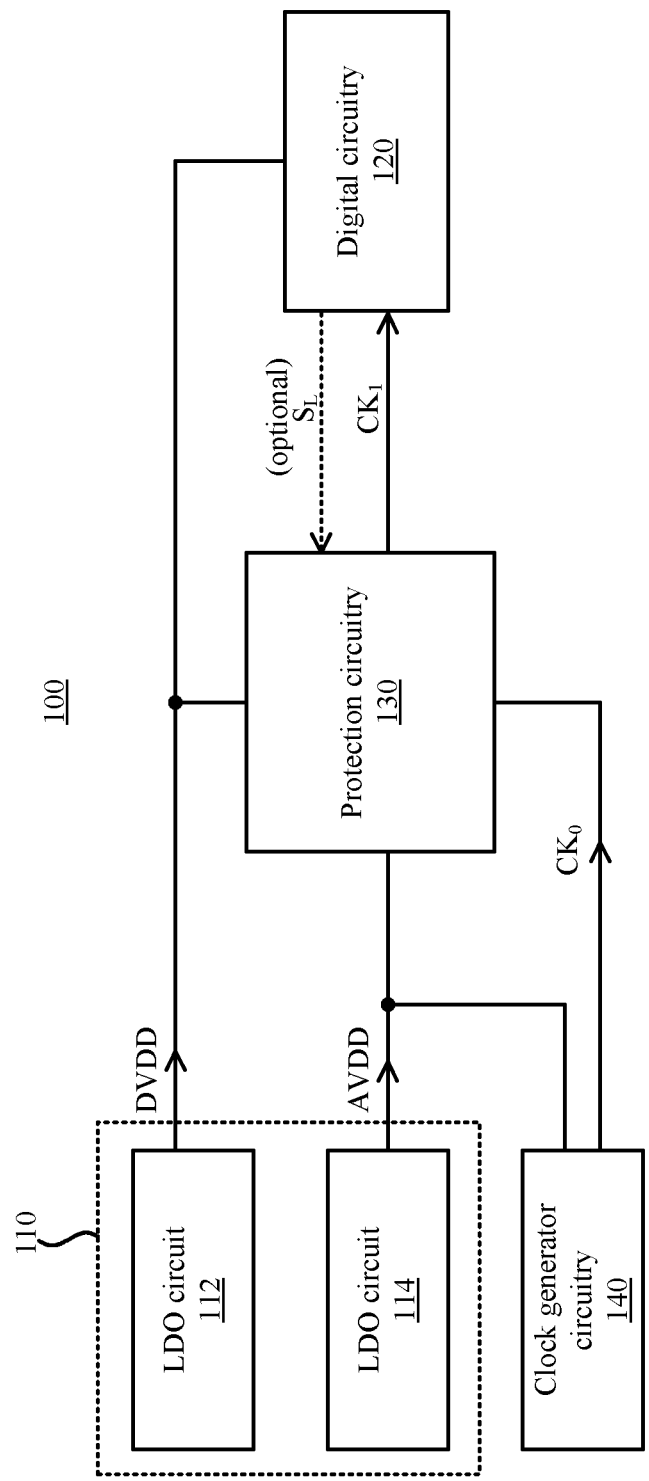
FIG. 1 is a schematic diagram of a digital circuit device according to some embodiments of the present disclosure

FIG. 1 is a schematic diagram of a digital circuit device 100 according to some embodiments of the present disclosure. The digital circuit device 100 includes a power supply circuitry 110, a digital circuitry 120, a protection circuitry 130, and a clock generator circuitry 140. The power supply circuitry 110 generates a supply voltage DVDD and the supply voltage AVDD. In some embodiments, the supply voltage DVDD drives (i.e., powers) digital circuit(s) in the digital circuitry 120 and the protection circuitry 130, and the supply voltage AVDD drives analog circuit(s) in the protection circuitry 130. In some embodiments, the power supply circuitry 110 includes a low dropout regulator (LDO) circuit 112 and an LDO circuit 114. The LDO circuit 112 generates the supply voltage DVDD, and the LDO circuit 114 generates the supply voltage AVDD.

The digital circuitry 120 includes at least one digital circuit (e.g., a processor circuit, a flip flop circuit, a logic circuit, and so on). The at least one digital circuit is protected by the protection circuitry 130, in order to avoid an error voltage variation which is due to a large transient current that occurs in internal circuits. The digital circuitry 120 performs at least one operation according to a clock signal $CK_1$. For example, a flip flop circuit in the digital circuitry 120 may transfer data according to the clock signal $CK_1$. Alternatively, a processor circuit in the digital circuitry 120 may perform an algorithm according to the clock signal $CK_1$. The above examples of at least one operation are given for illustrative purposes, and the present disclosure is not limited thereto. When at least one circuit in the digital circuitry 120 performs the at least one operation, an output and/or a conducting state of the at least one circuit is switched.

In some embodiments, the digital circuitry 120 is further configured to output a load signal $S_L$ according to an operating condition, in order to indicate that the digital circuitry 120 operates under a heavy load or a light load. Operations regarding herein will be described with reference to FIG. 5A and FIG. 5B.

The protection circuitry 130 generates the clock signal $CK_1$ according to a clock signal $CK_0$. The protection circuitry 130 further adjusts the clock signal $CK_1$ according to at least one of a voltage drop of the supply voltage DVDD and the load signal $S_L$. As a result, the protection circuitry 130 is able to prevent the digital circuitry 120 from having the large transient current, in order to keep the operating voltage of the digital circuitry 120 being stable. Operations about the protection circuitry 130 will be described with reference to the following figures. The clock generator circuitry 140 provides the clock signal $CK_0$. In some embodiments, the clock generator circuitry 140 may be (but not limited to) implemented with a phase-locked loop circuit.

Figure 2:
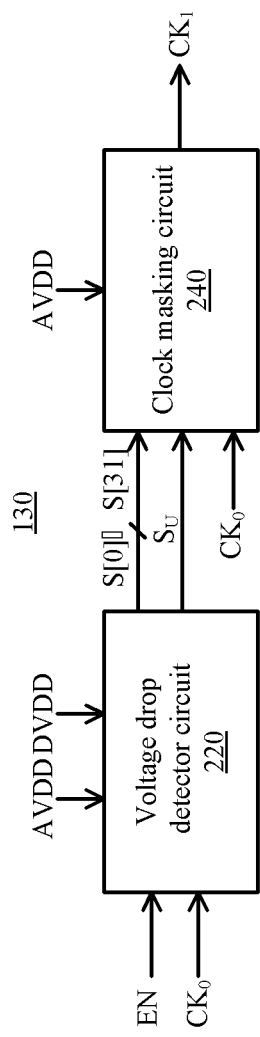
FIG. 2 is a schematic diagram of the protection circuitry in FIG. 1 according to some embodiments of the present disclosure.

FIG. 2 is a schematic diagram of the protection circuitry 130 in FIG. 1 according to some embodiments of the present disclosure. In this example, the protection circuitry 130 adjusts the clock signal $CK_1$ according to the voltage drop of the supply voltage DVDD. The protection circuitry 130 includes a voltage drop detector circuit 220 and a clock masking circuit 240. The voltage drop detector circuit 220 is coupled to the LDO circuit 112 and the LDO circuit 114 in FIG. 1, in order to receive the supply voltage DVDD and the supply voltage AVDD. The voltage drop detector circuit 220 continues to detect the voltage drop of the supply voltage DVDD, and is triggered to output flag signals S[0]-S[31] and an update signal $S_U$ according to an enable signal EN and the clock signal $CK_0$.

The clock masking circuit 240 adjusts the clock signal $CK_0$ according to the update signal $S_U$ and the flag signals S[0]-S[31], in order generate the clock signal $CK_1$. For example, if the flag signals S[0]-S[31] are "00111111111111111111111111111111," the clock masking circuit 240 masks a corresponding number of pulses in the clock signal $CK_0$ according to a number of logic values of 0 in the flag signals S[0]-S[31] (which is two in this example), and outputs the adjusted clock signal $CK_0$ to be the clock signal $CK_1$. As a result, if the supply voltage DVDD begins to decrease, the protection circuitry 130 is able to reduce the number of switching in the digital circuitry 120 by adjusting the number of pulses in the clock signal $CK_1$. As a result, the increment of a current in the digital circuitry 120 is reduced, and thus the voltage drop of the supply voltage DVDD is also reduced.

Figure 3A:
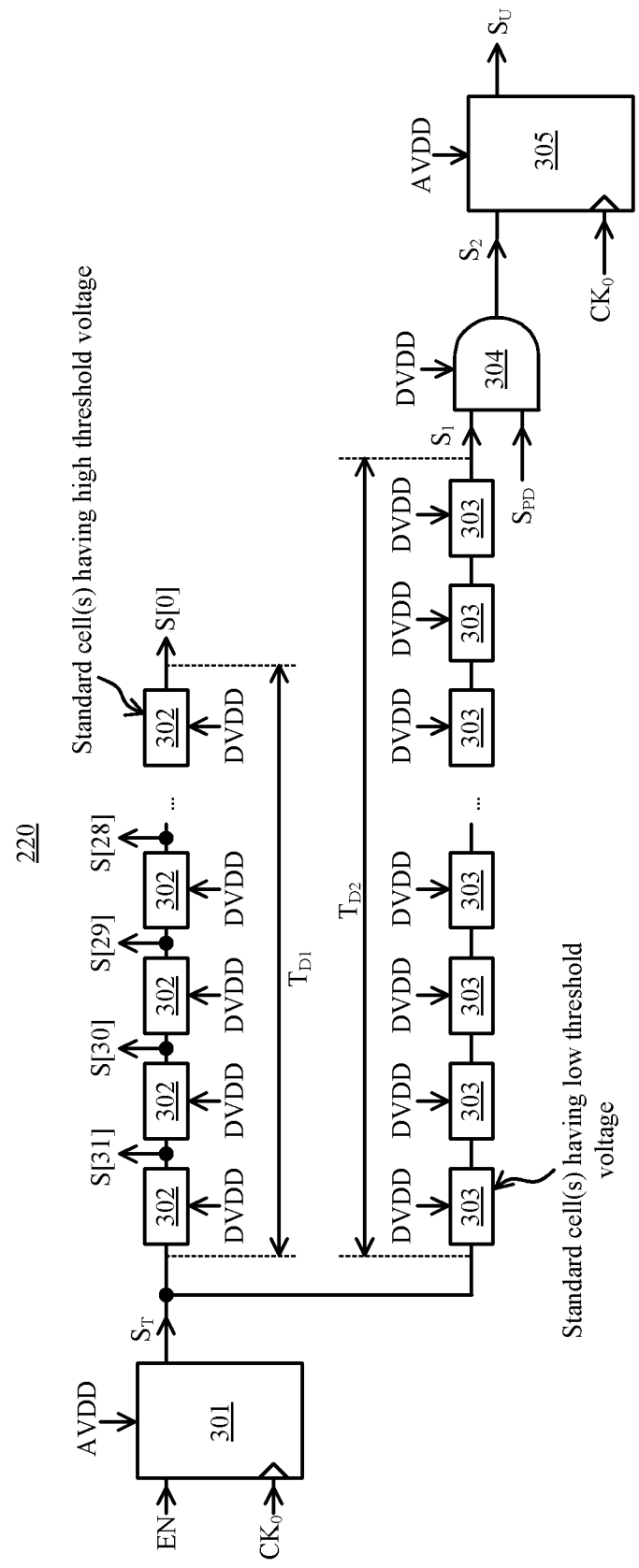
FIG. 3A is a schematic diagram of the voltage drop detector circuit in FIG. 2 according to some embodiments of the present disclosure.

FIG. 3A is a schematic diagram of the voltage drop detector circuit 220 in FIG. 2 according to some embodiments of the present disclosure. The voltage drop detector circuit 220 includes a flip flop circuit 301, delay circuits 302, delay circuits 303, a logic gate circuit 304, and a flip flop circuit 305. In this example, each of the delay circuits 302, the delay circuits 303, and the logic gate circuit 304 may be a digital circuit. The flip flop circuit 301 outputs the enable signal EN to be a testing signal $S_T$ according to the clock signal $CK_0$.

The delay circuits 302 and the delay circuits 303 are driven by the supply voltage DVDD. In some embodiments, in FIG. 3A, a delay time introduced by one the delay circuit 302 is set to be longer than a delay time introduced by one delay circuit 303, and a voltage sensitivity of one delay circuit 302 is higher than a voltage sensitivity of one delay circuit 303. In other words, when the voltage drop of the supply voltage DVDD is increased, an increment of the delay time introduced by one delay circuit 302 is greater than an increment of the delay time introduced by the one delay circuit 303. For example, each delay circuit 302 may be implemented with standard cell(s) having a high threshold voltage, and each delay circuit 303 may be implemented with standard cell(s) having a low threshold voltage (i.e., a threshold voltage of the delay circuit 302 is higher than a threshold voltage of the delay circuit 303). In some embodiments, the standard cell may include (but not limited to) at least one of an inverter circuit, a flip flop circuit, an AND gate circuit, an OR gate circuit, and so on. The delay circuits 302 are coupled in series to form a first delay chain circuit, and the delay circuits 303 are coupled in series to form a second delay chain circuit. In this embodiment, a total delay time $T_{D1}$ of the first delay chain circuit is set to be the same as a total delay time $T_{D2}$ of the second delay chain circuit. Therefore, a number of the delay circuit 303 is more than a number of the delay circuit 302. The above implementations of the delay circuits 302 and the delay circuits 303 are given for illustrative purposes, and the present disclosure is not limited thereto.

In an initial state (e.g., when the enable signal EN has a logic value of 0), the flip flop circuit 301 is reset, and outputs of the delay circuit 302 and outputs of the delay circuit 303 are also reset to have first logic values (e.g., logic values of 0). Afterwards, the flip flop circuit 301 outputs the enable signal EN having a second logic value (e.g., a logic value of 1) to be the testing signal $S_T$ according to the clock signal $CK_0$. The delay circuits 302 delay the testing signal $S_T$ to generate the flag signals S[0]-S[31] respectively. The delay circuits 303 delay the testing signal $S_T$ to generate a signal $S_1$. The logic gate circuit 304 is configured to generate a signal $S_2$ according to the signal $S_1$ having the second logic value and a control signal $S_{PD}$. Equivalently, when the testing signal $S_T$ is transmitted to logic gate circuit 304 through all delay circuits 303, the logic gate circuit 304 generates the signal $S_2$. In some embodiments, the control signal $S_{PD}$ may be the enable signal EN, and the logic gate circuit 304 may be implemented with an AND gate circuit. The flip flop circuit 305 outputs the signal $S_2$ to be the update signal $S_U$ having the second logic value according to the clock signal $CK_0$.

As mentioned above, the total delay time $T_{D1}$ is set to be the same as the total delay time $T_{D2}$. When the testing signal $S_T$ is transmitted to the logic gate circuit 304, the logic gate circuit 304 generates the signal $S_2$, and the flip flop circuit 305 outputs the update signal $S_U$ accordingly. If the voltage drop of the supply voltage DVDD is sufficiently low. The total delay time $T_{D1}$ is substantially equal to the total delay time $T_{D2}$. Under this condition, when the update signal $S_U$ having the second logic value is generated, all of the flag signals S[0]-S[31] have the second logic values. If the voltage drop of the supply voltage DVDD becomes higher (i.e., the supply voltage DVDD becomes lower), operation speed of the delay circuits 302 and that of the delay circuits 303 become slower. As the delay circuits 302 and the delay circuits 303 have different configurations, each delay circuit 303 has a lower rate of increasing delay time when the voltage becomes lower. Under this condition, the total delay time $T_{D1}$ will be longer than the total delay time $T_{D2}$. As a result, when the update signal $S_U$ having the second logic value is generated, a part of the flag signals S[0]-S[31] may have the first logic values.

Accordingly, by reading the flag signals S[0]-S[31] in response to the update signal $S_U$, the voltage drop of the supply voltage DVDD can be detected. For example, when the update signal $S_U$ has the second logic value, the relation between the flag signals S[0]-S[31] and the supply voltage DVDD is listed in the following table:

| Voltage drop | S[31] | S[30] | S[29] | S[28] | ... | S[1] | S[01] | Number of logic values of 1 |
|---|---|---|---|---|---|---|---|---|
| <10 mV | 1 | 1 | 1 | 1 | ... | 1 | 1 | 32 |
| 10-20 mV | 1 | 1 | 1 | 1 | ... | 1 | 0 | 31 |
| 20-30 mV | 1 | 1 | 1 | 1 | ... | 0 | 0 | 30 |
| . | | | | | | | | |
| . | | | | | | | | |
| 300-310 mV | 1 | 1 | 0 | 0 | ... | 0 | 0 | 2 |
| >310 mV | 1 | 0 | 0 | 0 | ... | 0 | 0 | 1 |

According to the above table, if the voltage drop of the supply voltage DVDD is lower, a number of the second logic values (e.g., the logic values of 1) in the flag signals S[0]-S[31] is more. Alternatively, if the voltage drop of the supply voltage DVDD is higher, the number of the second logic values is less. Accordingly, the flag signals S[0]-S[31] is able to indicate the voltage drop of the supply voltage DVDD.

Figure 3B:
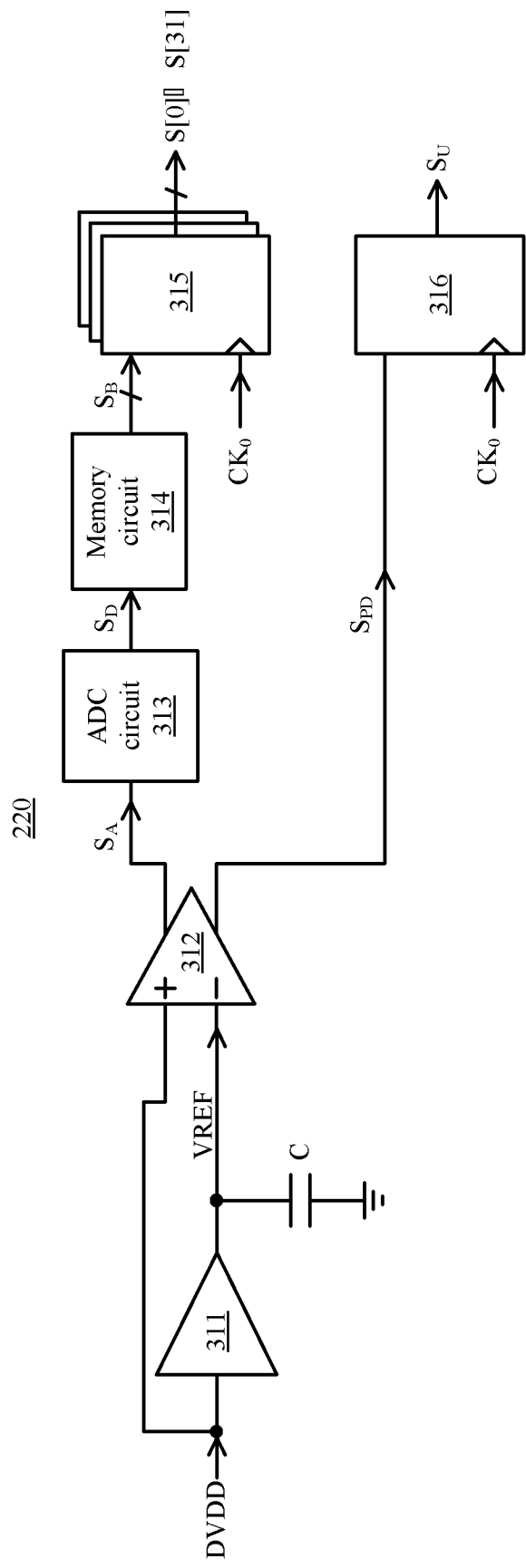
FIG. 3B is a schematic diagram of the voltage drop detector circuit in FIG. 2 according to some embodiments of the present disclosure.

FIG. 3B is a schematic diagram of the voltage drop detector circuit 220 in FIG. 2 according to some embodiments of the present disclosure. The voltage drop detector circuit 220 in FIG. 3B includes a buffer circuit 311, a capacitor C, an amplifier circuit 312, an analog to digital converter (ADC) circuit 313, a memory circuit 314, flip flop circuits 315, and a flip flop circuit 316. In this example, the voltage drop detector circuit 220 includes analog circuit(s) (which may be, for example, the amplifier circuit 312 and/or certain circuits in the ADC circuit 313, which are driven by the supply voltage AVDD (not shown). The rest digital circuits are able to be driven by the supply voltage DVDD (not shown).

The capacitor C is coupled to an output terminal of the buffer circuit 311. The buffer circuit 311 outputs a reference voltage VREF according to the supply voltage DVDD. The amplifier circuit 312 amplifies a difference between the supply voltage DVDD and the reference voltage VREF (which equals to the voltage drop of the supply voltage DVDD), in order to generate a signal $S_A$ and the control signal $S_{PD}$. For example, the amplifier circuit 312 may be implemented with a fully differential amplifier, in order to generate the signal $S_A$ and the control signal $S_{PD}$ according to the supply voltage DVDD and the reference voltage VREF.

The ADC circuit 313 converts the signal $S_A$ to be a digital code $S_D$, which is for indicating the voltage drop of the supply voltage DVDD. The memory circuit 314 stores a look-up table (which may be the table shown above). The memory circuit 314 may select corresponding control codes $S_B$ from the look-up table according to the digital code $S_D$, and output the control codes $S_B$ to the flip flop circuits 315. The flip flop circuits 315 output the control codes $S_B$ to be the flag signals S[0]-S[31] respectively according to the clock signal $CK_0$. The flip flop circuit 316 outputs the control signal $S_{PD}$ to be the update signal $S_U$ according to the clock signal $CK_0$.

Figure 4:
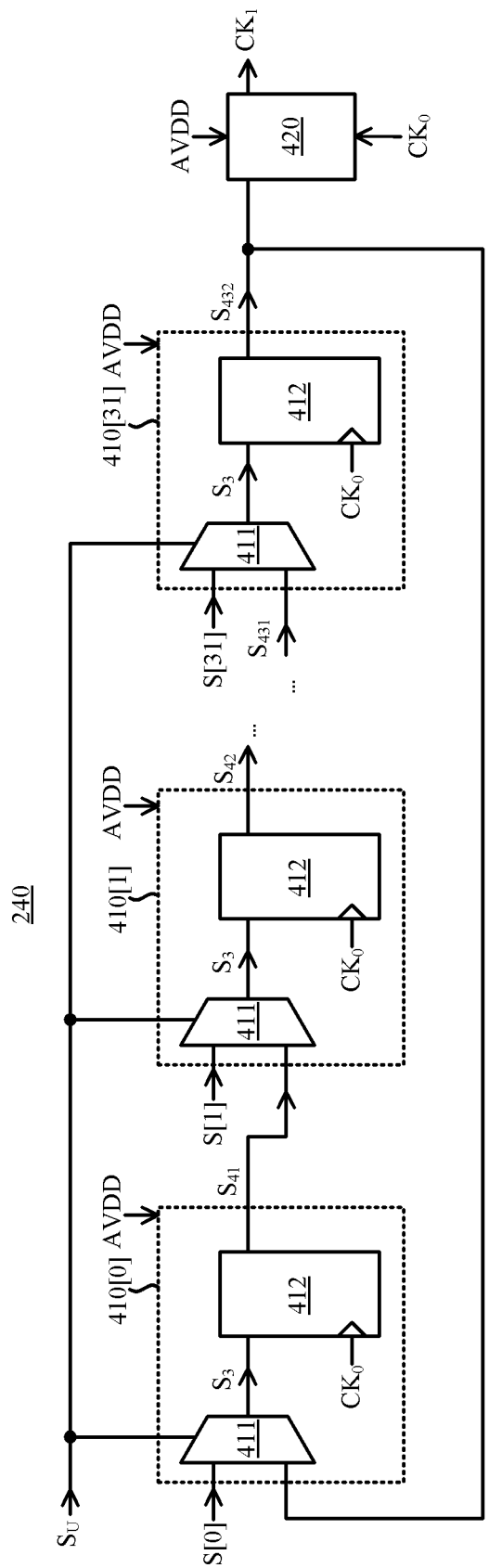
FIG. 4 is a schematic diagram of the clock masking circuit in FIG. 2 according to some embodiments of the present disclosure.

FIG. 4 is a schematic diagram of the clock masking circuit 240 in FIG. 2 according to some embodiments of the present disclosure. The clock masking circuit 240 includes selector circuits 410[0]-410[31] and a clock gating circuit 420. The selector circuits 410[0]-410[31] are coupled in series, and sequentially generates signals $S_{41}, S_{42}, \ldots, S_{432}$. Taking the selector circuit 410[0] as an example, the selector circuit 410[0] receives the last signal $S_{432}$ and the flag signal S[0], and outputs the signal $S_{432}$ or the flag signal S[0] to be the signal $S_{41}$ according to the update signal $S_U$. Taking the selector circuit 410[1] as an example, the selector circuit 410[1] receives the previous signal $S_{41}$ from a previous selector circuit 410[0] and the flag signal S[1], and outputs the signal $S_{41}$ or the flag signal S[1] to be the signal $S_{42}$ according to the update signal $S_U$. With this analogy, the arrangement of each of the selector circuits 410[0]-410[31] can be understood.

Each of the selector circuits 410[0]-410[31] includes a multiplexer circuit 411 and a flip flop circuit 412. Taking the selector circuit 410[0] as an example, in the selector circuit 410[0], the multiplexer circuit 411 outputs the signal $S_{432}$ or the flag signal S[0] to be a corresponding signal $S_3$ according to the update signal $S_U$. In the selector circuit 410[0], the flip flop circuit 412 outputs the corresponding signal $S_3$ to be the signal $S_{41}$ according to the clock signal $CK_0$. In various embodiments, the flip flop circuits 301, 305, 315, 316, and 412 may be (but not limited to) D-type flip flop circuits.

The clock gating circuit 420 may be driven by the supply voltage AVDD, in order to reduce impacts from the voltage drop. The clock gating circuit 420 adjusts the clock signal $CK_0$ according to the last signal $S_{432}$, in order to generate the clock signal $CK_1$. For example, when the signal $S_{432}$ has the first logic value, the clock gating circuit 420 does not output pulse(s) of the clock signal $CK_0$. As a result, one pulse of the clock signal $CK_1$ is masked. When the signal $S_{432}$ has a second logic value, the clock gating circuit 420 outputs the pulse(s) of the clock signal $CK_0$ to be the clock signal $CK_1$. In some embodiments, the clock gating circuit 420 may be (but not limited to) implemented with an integrated clock gating (ICG) circuit cell.

Figure 5A:
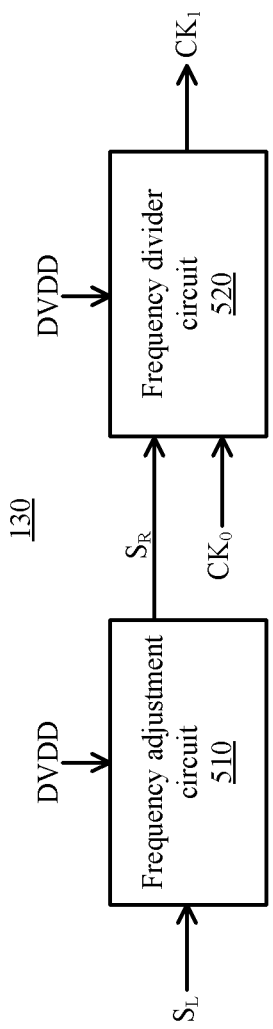
FIG. 5A is a schematic diagram of the protection circuitry in FIG. 1 according to some embodiments of the present disclosure.

FIG. 5A is a schematic diagram of the protection circuitry 130 in FIG. 1 according to some embodiments of the present disclosure. In this example, the protection circuitry 130 adjusts the clock signal $CK_1$ according to the load signal $S_L$. As mentioned above, the digital circuitry 120 determines the load signal $S_L$ according to operating condition(s), in order to indicate that the digital circuitry 120 is going to operate under the heavy load or the light load. For example, when a processor circuit (not shown) that executes an algorithm or firmware in the digital circuitry 120 is going to execute an intensive computation (e.g., calculating a fast Fourier transform), the digital circuitry 120 may output the load signal $S_L$ having the logic value of 1, in order to indicate that the digital circuitry 120 is going to operate under the heavy load. Alternatively, when a power management circuit (not shown) acquires that the digital circuitry 120 is going to be switched from a standby mode to a busy mode, the digital circuitry 120 may output the load signal $S_L$ having the logic value of 1, in order to indicate that the digital circuitry 120 is going to operate under the heavy load. Alternatively, a clock switching circuit (not shown) in the digital circuitry 120 acquires that the current calculation requires more clock signals, the digital circuitry 120 may output the load signal $S_L$ having the logic value of 1, in order to indicate that the digital circuitry 120 is going to operate under the heavy load.

The protection circuitry 130 in FIG. 5A includes a frequency adjustment circuit 510 and a frequency divider circuit 520. The frequency adjustment circuit 510 determines a control ratio $S_R$ according to the load signal $S_L$. Operations regarding herein will be described with reference to FIG. 5B. The frequency divider circuit 520 generates the clock signal $CK_1$ according to the control ratio $S_R$ and the clock signal $CK_0$. For example, a frequency of the clock signal $CK_0$ is f1. The frequency divider circuit 520 may generate the clock signal $CK_1$ having a frequency f2 according to the clock signal $CK_0$, in which the frequency f2 is $f1/S_R$.

Figure 5B:
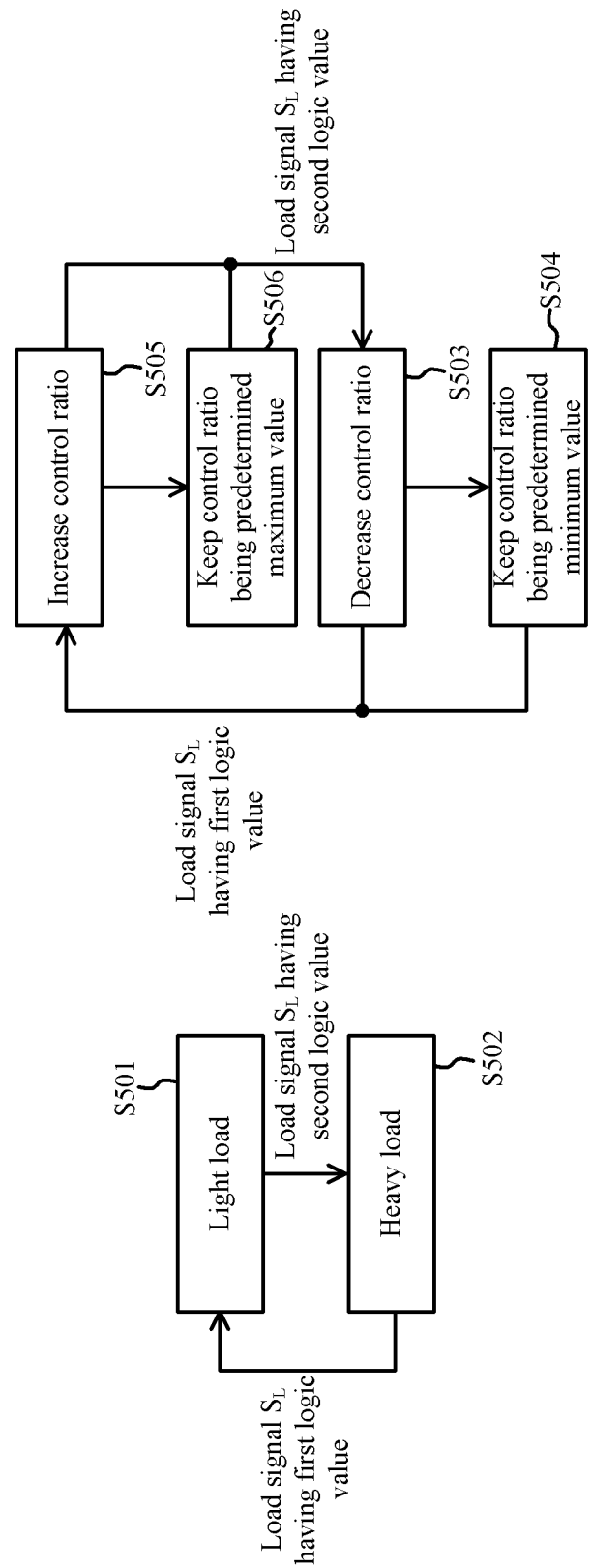
FIG. 5B is a flow chart of operations of the frequency adjustment circuit in FIG. 5A according to some embodiments of the present disclosure.

FIG. 5B is a flow chart of operations of the frequency adjustment circuit 510 in FIG. 5A according to some embodiments of the present disclosure. In some embodiments, the frequency adjustment circuit 510 may be implemented with a state machine or a digital controller circuit that performs operation S503 to operation S506 in FIG. 5B. As mentioned above, if the digital circuitry 120 predicts that the operating condition is going to be switched from the light load to the heavy load, the digital circuitry 120 outputs the load signal $S_L$ having the second logic value (e.g., the logic value of 1) (i.e., operation S501). Alternatively, if the digital circuitry 120 predicts that the operating condition is going to be switched from the heavy load to the light load, the digital circuitry 120 outputs the load signal $S_L$ having the first logic value (e.g., the logic value of 0) (i.e., operation S502).

In response to the load signal $S_L$ having the second logic value, the frequency adjustment circuit 510 decreases the control ratio $S_R$ (i.e., operation S503). If the load signal $S_L$ keeps having the second logic value, the frequency adjustment circuit 510 decreases the control ratio $S_R$ to be a predetermined minimum value (e.g., 1), and keeps the control ratio $S_R$ to be the predetermined minimum value (i.e., operation S504). In other words, when the digital circuitry 120 is going to operate under the heavy load, the protection circuitry 130 gradually increases the frequency of the clock signal $CK_1$.

In response to the load signal $S_L$ returning the first logic value, the frequency adjustment circuit 510 increases the control ratio $S_R$ (i.e., operation S505). If the load signal $S_L$ keeps having the first logic value, the frequency adjustment circuit 510 increases the control ratio $S_R$ to a predetermined maximum value (e.g., 64, 128, and so on), and keeps the control ratio being the predetermined maximum value (i.e., operation S506). In other words, when the digital circuitry 120 is going to operate under the light load, the protection circuitry 130 gradually increases the frequency of the clock signal $CK_1$. With the above operations, the protection circuitry 130 is able to gradually increase or decrease the frequency of the clock signal $CK_1$ in response to an expected change to the operating condition of the digital circuitry 120, in order to prevent the digital circuitry 120 having the large transient current.

Figure 6:
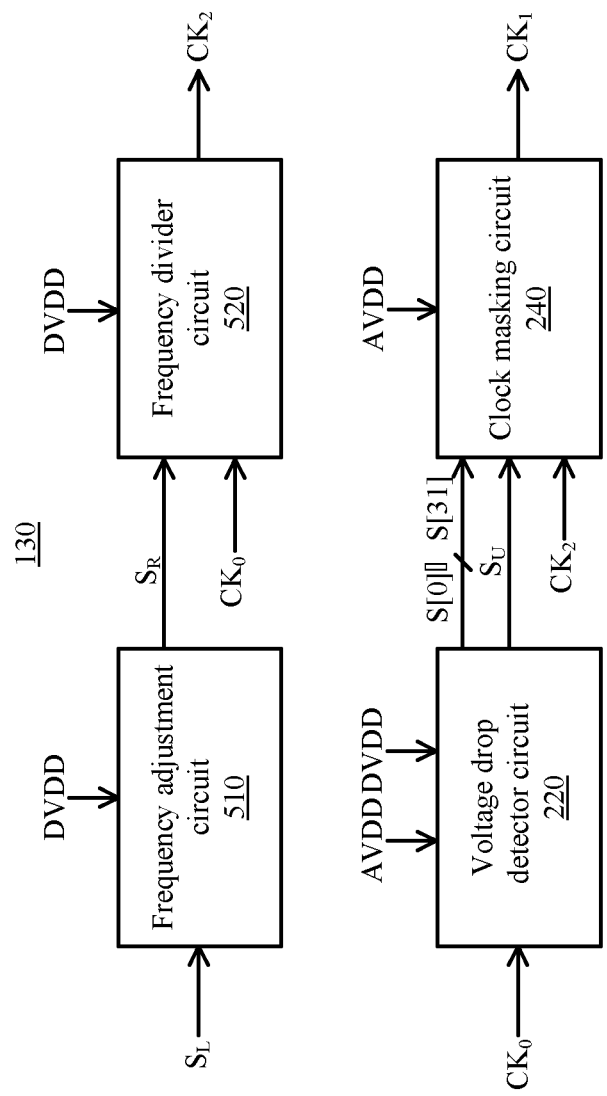
FIG. 6 is a schematic diagram of the protection circuitry in FIG. 1 according to some embodiments of the present disclosure.

FIG. 6 is a schematic diagram of the protection circuitry 130 in FIG. 1 according to some embodiments of the present disclosure. In this example, the protection circuitry 130 adjusts the clock signal $CK_1$ according to the voltage drop of the supply voltage DVDD and/or the load signal $S_L$. The protection circuitry 130 includes the voltage drop detector circuit 220, the clock masking circuit 240, the frequency adjustment circuit 510, and a frequency divider circuit 520. This embodiment combines arrangements shown in FIG. 2 and FIG. 5, the frequency divider circuit outputs the clock signal $CK_2$ to the clock masking circuit 240, and the clock masking circuit 240 outputs the clock signal $CK_1$ to the digital circuitry 120. In other words, the frequency divider circuit 520 generates the clock signal $CK_2$ according to the clock signal $CK_0$ and the control ratio $S_R$, and the clock masking circuit 240 adjust the clock signal $CK_2$ according to the update signal $S_U$ and the flag signals S[0]-S[31], in order to generate the clock signal $CK_1$. The detailed arrangements of the above circuits can be understood with reference to the previous embodiments, and thus the repetitious descriptions are not further given.

As described above, the digital circuit device provided in some embodiments of the present disclosure is able to instantly regulate the power consumption of the digital circuitry by detecting the voltage drop of the supply voltage or by responding an expected operating condition, in order to protect the digital circuitry against malfunctions. As a result, the design constraints of the digital circuitry can be eased. Furthermore, the voltage drop detector circuit provided in some embodiments of the present disclosure is implemented with all digital circuits. Compared to general approaches utilizing analog circuit(s) in the industry, such implementation is able to save more circuit area and power consumption.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A digital circuit device, comprising:
   a power supply circuitry configured to output a supply voltage;

a digital circuitry configured to be driven by the supply voltage, and configured to perform at least one operation according to a first clock signal; and a protection circuitry configured to generate the first clock signal according to at least one of a voltage drop of the supply voltage and a load signal sent from the digital circuitry, wherein the protection circuitry comprises:

a voltage drop detector circuit configured to detect the voltage drop and to generate a plurality of flag signals and an update signal according to an enable signal and a second clock signal; and a clock masking circuit configured to adjust the second clock signal according to the plurality of flag signals and the update signal, in order to generate the first clock signal.

2. The digital circuit device of claim 1, wherein the voltage drop detector circuit comprises:

a first flip flop circuit configured to output the enable signal to be a testing signal according to the second clock signal;

a plurality of first delay circuits configured to be driven by the supply voltage and to delay the testing signal, in order to generate the plurality of flag signals;

a plurality of second delay circuits configured to be driven the supply voltage and to delay the testing signal, in order to generate a first signal;

a logic gate circuit configured to generate a second signal according to the first signal and a control signal; and a second flip flop circuit configured to output the second signal to be the update signal according to the second clock signal.

3. The digital circuit device of claim 2, wherein when the voltage drop is increased, an increment of a delay time of each of the plurality of first delay circuits is more than an increment of a delay time of each of the plurality of second delay circuits.

4. The digital circuit device of claim 2, wherein a total delay time of the plurality of first delay circuits is the same as a total delay time of the plurality of second delay circuits.

5. The digital circuit device of claim 2, wherein each of the plurality of first delay circuits has a first threshold voltage, each of the plurality of second delay circuits has a second threshold voltage, and the first threshold voltage is higher than the second threshold voltage.

6. The digital circuit device of claim 1, wherein the clock masking circuit comprises:

a plurality of selector circuits coupled in series, and configured to sequentially generate a plurality of first signals, wherein one of the plurality of selector circuits is configured to output a corresponding one of the plurality of flag signals or a previous signal of the plurality of first signals to be a corresponding one of the plurality of first signals according to the second clock signal; and a clock gating circuit configured to adjust the second clock signal according to a last first signal of the plurality of first signals, in order to generate the first clock signal.

7. The digital circuit device of claim 1, wherein if the voltage drop is lower, a number of predetermined logic values in the plurality of flag signals is more.

8. The digital circuit device of claim 1, wherein the voltage drop detector circuit comprises:

a buffer circuit;

a capacitor coupled to an output terminal of the buffer circuit, wherein the buffer circuit is configured to output a reference voltage according to the supply voltage;

an amplifier circuit configured to amplify a difference between the supply voltage and the reference voltage, in order to generate a first signal and a control signal;

an analog to digital converter circuit configured to covert the first signal to be a digital code;

a memory circuit configured to output a plurality of control codes according to the digital code;

a plurality of first flip flop circuits configured to output the plurality of control codes to be the plurality of flag signals respectively according to the second clock signal; and a second flip flop circuit configured to output the control signal to be the update signal according to the second clock signal.

9. The digital circuit device of claim 1, wherein the protection circuitry further comprises:

a frequency adjustment circuit configured to determine a control ratio according to the load signal;

a frequency divider circuit configured to generate a third clock signal according to the control ratio and the second clock signal; and the clock masking circuit further configured to adjust the third clock signal according to the plurality of flag signals and the update signal, in order to generate the first clock signal.

10. A voltage drop detector circuit, comprising:

a first flip flop circuit configured to output an enable signal to be a testing signal according to a clock signal;

a plurality of first delay circuits configured to be driven by a supply voltage and to delay the testing signal to generate a plurality of flag signals, wherein the plurality of flag signals are read in response to an update signal to indicate a voltage drop of the supply voltage;

a plurality of second delay circuits configured to be driven by the supply voltage and to delay the testing signal, in order to generate a first signal;

a logic gate circuit configured to generate a second signal according to the first signal and a control signal; and a second flip flop circuit configured to output the second signal to be the update signal according to the clock signal.

11. The voltage drop detector circuit of claim 10, wherein if the voltage drop is lower, a number of predetermined logic values in the plurality of flag signals is more.

12. The voltage drop detector circuit of claim 10, wherein when the voltage drop is increased, an increment of a delay time of each of the plurality of first delay circuits is more than an increment of a delay time of each of the plurality of second delay circuits.

13. The voltage drop detector circuit of claim 10, wherein a total delay time of the plurality of first delay circuits is the same as a total delay time of the plurality of second delay circuits.

14. The voltage drop detector circuit of claim 10, wherein each of the plurality of first delay circuits has a first threshold voltage, each of the plurality of second delay circuits has a second threshold voltage, and the first threshold voltage is higher than the second threshold voltage.

15. A digital circuit device, comprising:

a power supply circuitry configured to output a supply voltage;

a digital circuitry configured to be driven by the supply voltage, and configured to perform at least one operation according to a first clock signal; and a protection circuitry configured to generate the first clock signal according to at least one of a voltage drop of the supply voltage and a load signal sent from the digital circuitry, wherein the protection circuitry comprises:

a frequency adjustment circuit configured to determine a control ratio according to the load signal, wherein the frequency adjustment circuit is configured to increase the control ratio to a predetermined maximum value according to the load signal, or to decrease the control ratio to a predetermined minimum value according to the load signal; and a frequency divider circuit configured to generate the first clock signal according to the control ratio and a second clock signal.

* * * * *